United States Patent [19]

Canada et al.

[11] Patent Number: 5,404,049

[45] Date of Patent: Apr. 4, 1995

[54] FUSE BLOW CIRCUIT

[75] Inventors: Miles G. Canada, Colchester; Michael Nicewicz, Jericho, both of Vt.; John R. Rawlins, Wallkill; Carlos G. Rivadeneira, Wappingers Falls, both of N.Y.

[73] Assignee: International Business Machines Corporation, Armonk, N.Y.

[21] Appl. No.: 146,253

[22] Filed: Nov. 2, 1993

[51] Int. Cl.⁶ .............................................. H02H 7/20
[52] U.S. Cl. ........................................ 327/525; 326/38
[58] Field of Search .............. 307/202.1, 465; 365/96, 365/225.7

[56] References Cited

U.S. PATENT DOCUMENTS

| | | | |
|---|---|---|---|
| 4,532,607 | 7/1985 | Uchida | 307/202.1 |
| 4,686,384 | 8/1987 | Harvey | 307/202.1 |
| 4,937,465 | 6/1990 | Johnson | 307/202.1 |
| 5,270,976 | 12/1993 | Tran | 307/202.1 |

Primary Examiner—Edward P. Westin
Assistant Examiner—Andrew Sanders
Attorney, Agent, or Firm—Lynn L. Augspurger

[57] ABSTRACT

A chip can be provide with circuits to electrically read, blow and latch fuses. The circuit allows use of existing I/O pads used for other functions on a chip to drastically reduce the number of I/O required to blow fuses. The circuits also share critical high current carrying lines with no impact on fuse functionality and device reliability. By offering of complex fuse operations such as electrical override, even after they had been blown, essential for product screening and product diagnostics. The circuit provides a fuse blow circuit fed by a fuse sense circuit and fuse latch circuit. Stored addresses in an address buffer addresses the fuses with two sets of inputs: one providing electrical override and/or fuse blow information; and the second one, normal fuse status. Fuse integrity before and after blow is maximized with a dual voltage source drive and low current sensing.

14 Claims, 4 Drawing Sheets

| TABLE 1. FUSE CONTROL (CNTL) FUNCTIONALITY ||||||
|---|---|---|---|---|---|
| FCNTL INPUTS || FCNTL OUTPUTS ||| FUSE LATCH | OPERATION |
| FSELX | ESELX | ESEL | LATCH | FSEL | OUTPUTS | |
| 0 | X | 0 | 0 | 1 | FUSE SENSE | READ FUSE |
| 1 | 1 | 1 | 0 | 0 | ADDRESS | OVERRIDE FUSE |
| 1 | 0 | 0 | 1 | 0 | LATCH | LATCH FIXED |

FIG.3

FUSE BLOW CIRCUIT

FIELD OF THE INVENTION

This invention is related to VLSI semiconductor chips and particularly to a technique to electrically read, blow and latch fuses when using fuse technology.

BACKGROUND OF THE INVENTION

As background for our invention, current practice for fuses on chips normally requires the use of a single I/O pad per each fuse used on a chip. This is done to accomodate the high currents and voltages needed to blow the fuses reliably. This method is costly because it consumes a high number of I/O pads, which severely decreases the number of I/O's pads available for chip functionality. As chip densities increase, this reduction is no longer acceptable.

SUMMARY OF THE INVENTION

Our invention deals with the use of existing I/O pads used for other functions on a chip to address the fuses so that the fuses can be read, blown or electrically by-passed. It also deals with sharing critical high current carrying lines with no impact on fuse functionality and device reliability.

The improvements which we have made achieve three things. First, they significantly reduce the number of external I/O pads required for fuse technology. Second, they offer the flexibility of complex fuse operations such us electrical override even after they had been blown, essential for product screening and product diagnostics. And thirdly, the reliability of the fuses is maximized during all fuse operations, such as fuse blow and fuse sense.

These improvements are accomplished by providing a fuse latch chip fuse blow circuit that permanently reads the outputs of the I/O Address buffers and the fuse sense and has the capability of loading either one of those into the fuse latch. The fuse latch will output the state of the address or the fuse according to the instructions of a fuse control circuit. This output is used as required by the chip functionality and by the fuse blow circuit.

The reliability of the devices during a blow operation is accomplished by defining the fuse blow voltage with dual power sources. The fuse reliability is accomplished by using a trickle current during sensing.

These and other improvements are set forth in the following detailed description. For a better understanding of the invention with advantages and features, refer to the description and to the drawings.

BRIEF DESCRIPTION OF THE DRAWINGS

FIG. 3 shows a truth table of how the Fuse CNTL circuit must behave in order to properly control the flow of information thru the Fuse Latch to accomplish the expected functions.

Our detailed description explains the preferred embodiments of our invention, together with advantages and features, by way of example with reference to the following drawings.

DETAILED DESCRIPTION OF THE INVENTION

Before considering our preferred embodiments in detail, it may be worthwhile to illustrate, by way of example, how many I/O pads can be really saved over prior art. The number of I/O pads required for a given application depends on the number of redundant word lines desired and the number of word address I/O's. If four sets of redundant word lines each of eight addresses are needed, earlier practice would require:

$$(\# \text{ redundant WL}) (\# \text{ Word Address} + 1) = \text{Total I/O pads}$$
$$(4)\ (8 + 1) = 36$$

Our invention will require significantly less I/O pads for the same application, since the fuses require no exclusive I/O pads, and the blow voltages can be shared.

$$(\# \text{ redundant WL}) (\# \text{ Blow Voltages}) = \text{Total I/O pads}$$
$$(4)\ (2) = 8$$

A reduction of 75% of I/O pads can, therefore, be realized. For both conditions, it was assumed that VEBLOW can be shared for a single fuse bank.

The Preferred Embodiment

Figure 1:
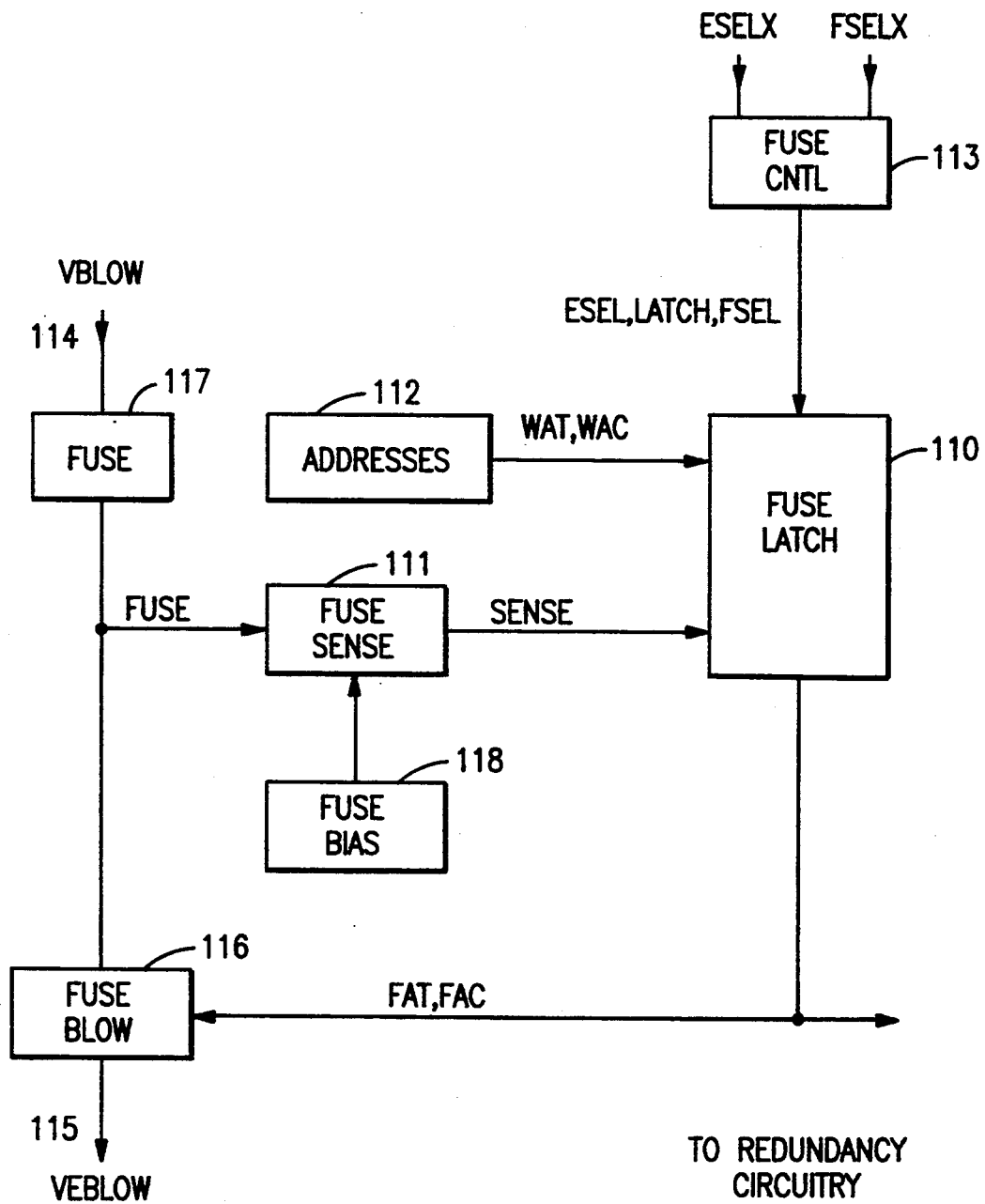
FIG. 1 shows schematically an overview of the preferred embodiment and particularly shows the Fuse Latch scheme.

The preferred embodiment is illustrated in the Figures. FIG. 1 shows schematically an overview of the preferred embodiment and particularly shows the fuse latch fuse blow circuit schematically. The center of this approach is the fuse latch 110 whose outputs are used to control whether the fuse is to be blown or not. As it is shown, it receives two sets of inputs; one, from the fuse sense circuit 111 (node SENSE) and, the second ones, from the address buffer 112 (nodes WAT,WAC). The input from the fuse sense 111 indicates the state of the fuse. The inputs from the address buffer 112, will be used to override the state of the fuse, or, to select tile fuse for a blow operation. The fuse control 113 (Fuse CNTL) circuit will determine which one will be selected. Once the correct input is chosen, that information is stored in the fuse latch 110 and preserved thereafter. The outputs of the fuse latch 110 (nodes FAT,FAC) can also drive other functions of the array, such as for redundancy operations.

To complete a fuse blow, a dual voltage approach has been taken to minimize impact on the devices around the fuse. The total voltage required for blowing the fuse is divided between the first upper 114 VBLOW and second lower 115 VEBLOW voltage sources.

Figure 2A:
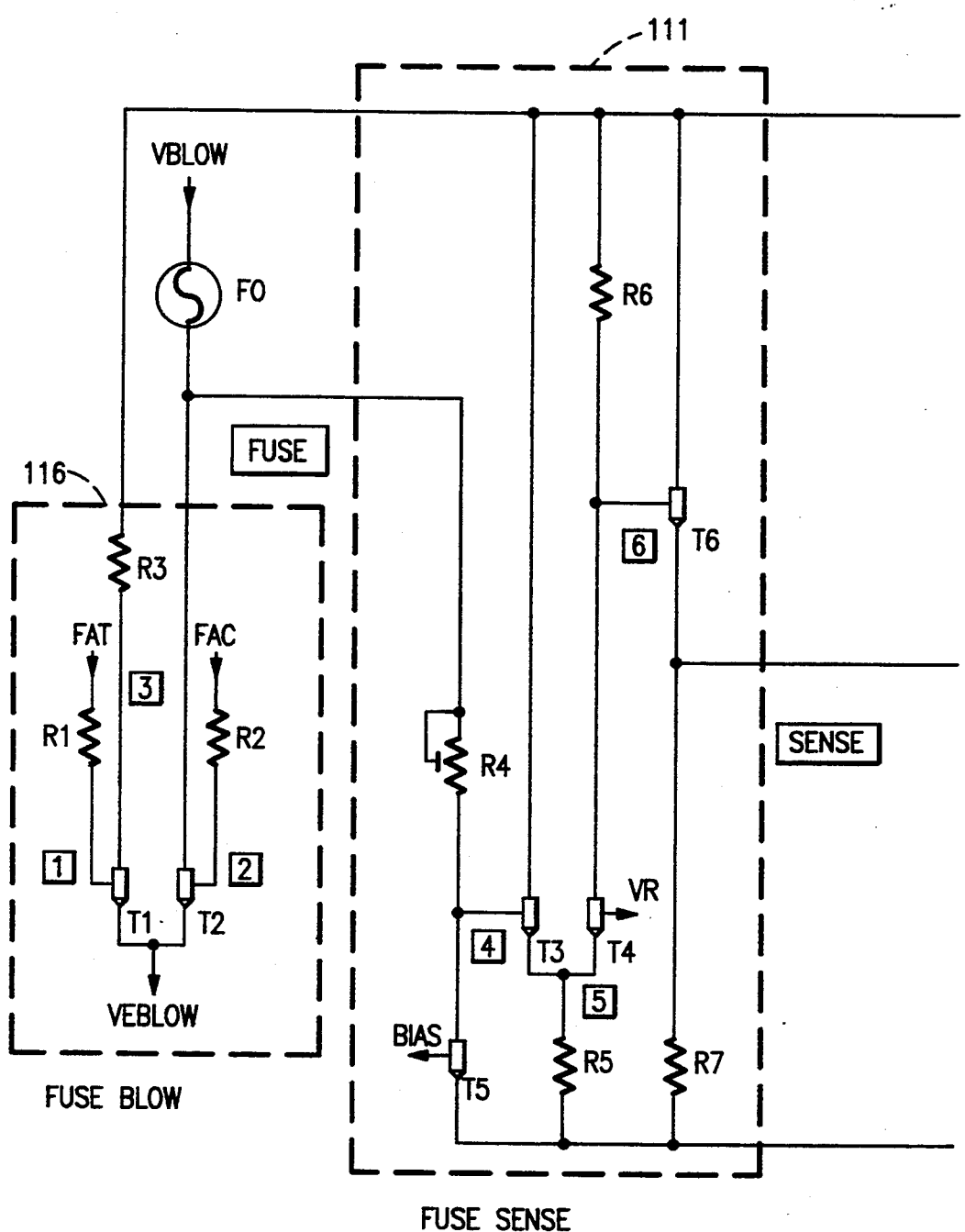
FIGS 2, 2A, and 2B show an actual implementation of the functional block diagram of FIG. 1.
Figures 2, 2B:
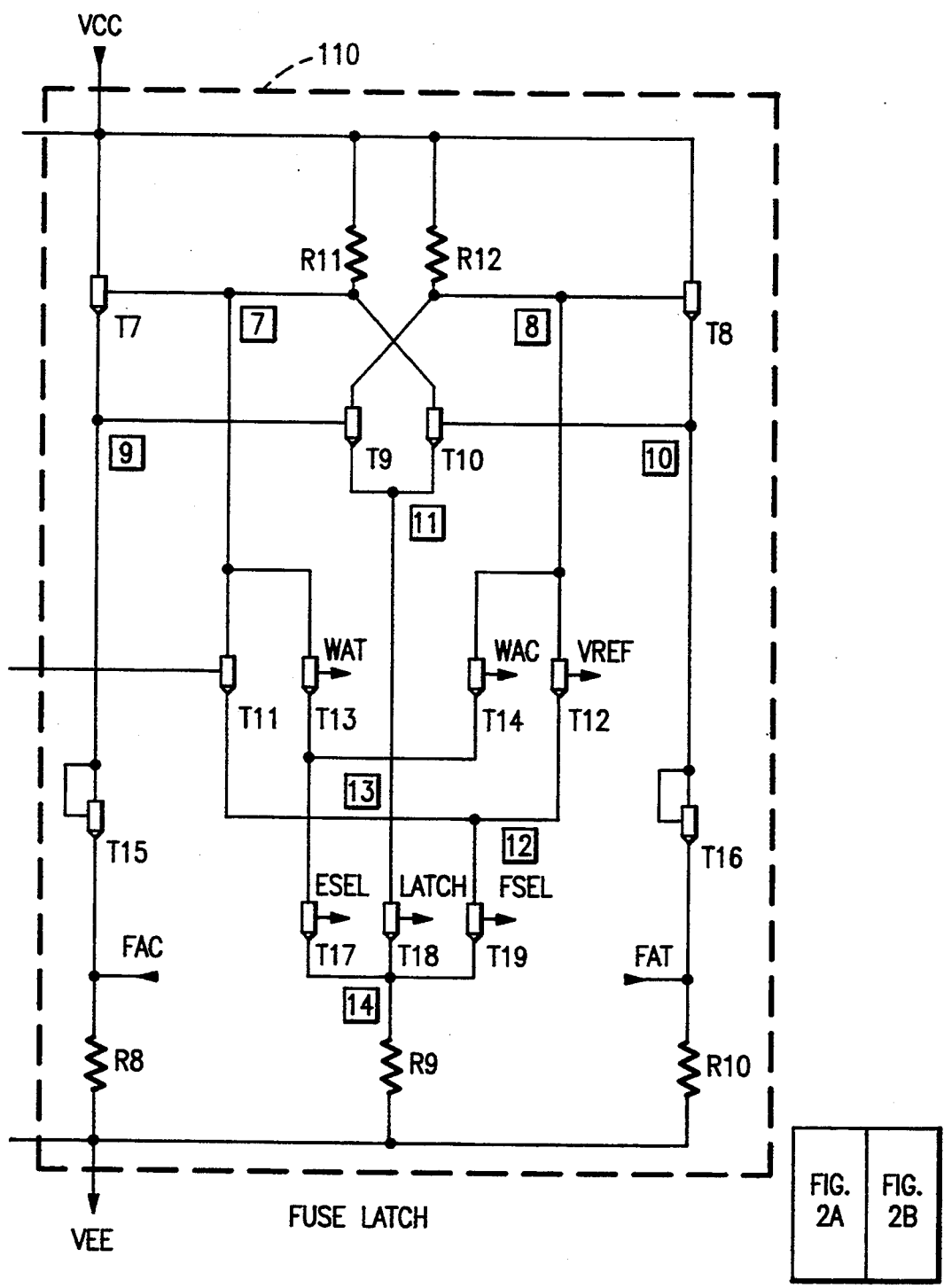

FIG. 2, 2A and 2B show an actual implementation of the functional block diagram of FIG. 1. A fuse CNTL circuit 113 provides the control signals illustrated by FIG. 3, and provides its three outputs within the fuse latch (ESEL, LATCH and FSEL) signals illustrated in FIG. 2B. An address buffer circuit 112 has its outputs (WAT,WAC) connected within the fuse latch as illustrated in FIG. 2B. The fuse sense 111 output (node SENSE) is an in-phase circuit with respect to node FUSE 117. Finally, the outputs of the fuse latch 110 (FAT,FAC) are shown how they drive the fuse blow circuit 116.

FIG. 3 shows a truth table of how the fuse CNTL circuit must behave in order to properly control the flow of information thru the Fuse Latch to accomplish the expected functions.

Turning now to our invention in greater detail, it will be seen that FIG. 1 illustrates our preferred embodiment in which a unique set of fuse latch 110, fuse sense 111, and fuse blow 116 circuits is required for each fuse 117 used. The fuse control circuit 113 whose functions are illustrated in FIG. 3 can be shared for a given bank of fuses. For every fuse 117 there must be a single address buffer, but the address buffer 112 is used to perform other functions of the array, such as decoding.

This embodiment of our invention assumes that the Fuse CNTL block, drives the fuse latch as shown in FIG. 3.

With particular reference to FIG. 2, 2A and 2B the normal chip operation can be understood. Under normal chip operation, VBLOW is tied to VCC and the VEBLOW node is left open. The fuse F0, can be sensed safely but it cannot be blown.

Whenever the FSELX input to the FCNTL circuit is logical '1' and ESELX is a logical '1', the address buffer outputs (WAT,WAC) are selected in the fuse latch, producing an electrical override. Also, the fuse latch will be able to select the fuse F0 if node FAC is a logical '1'. Then, the fuse can be blown if and only if VBLOW is brought to a higher voltage than VCC and VEBLOW is brought to VEE. A high current will flow through T2 and F0, saturating T2 and blowing the fuse open. The voltage across the F0 before fuse blow will be:

$$V\text{-fuse} = |VBLOW| + |VEBLOW| - VCEsat(T2)$$

This condition produces a lower voltage across the devices surrounding F0, particularly T2, avoiding breakdown. Also, because the VEBLOW is forced to a voltage source, the high transient currents resulting during a fuse blow, will not cause uneven distribution of currents, if more than one fuse is blown at the same time, resulting in successful fuse blows.

When FSELX input is a logical '0', the fuse latch will only react to the SENSE input, reflecting the state of the fuse F0. If a chip requires fuse redundancy, this will be the mode in which it will operate, to be able to read at all times the state of the fuse F0.

When FSELX input is a logical '1', and ESELX is a logical '0', the fuse latch stores the contents of the previous mode of operation. It cannot be disturbed, unless the FCNTL inputs are switched again. This condition is very valuable, because the contents of the fuse latch can be kept constant during normal test screening or diagnostics.

As seen in FIG. 2A, the fuse sensing operation is done by developing a voltage drop across R4 with a trickle current defined by the fuse bias circuit's 118 bias voltage and T5. If the fuse F0 has been blown, a logical '0' will appear in node 4 of the Fuse Sense circuit. The current used for sensing will not degrade the fuse reliability.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A fuse blow circuit for a VLSI chip comprising:

a VLSI chip substrate having a plurality of fuses coupled to a fuse control circuit;

said VLSI chip having a plurality of I/O terminal pads used for other functions on said chip and coupled between the fuses and the fuse control circuit to enable addressing the fuses so that the fuses can be read, blown or electrically bypassed, a fuse latch-blow circuit on said chip having a fuse blow circuit, a fuse sense circuit, a fuse latch circuit, and I/O address buffers, and wherein said fuse control circuit and fuse latch-blow circuit provides means for permanently reading outputs from the I/O address buffers and the fuse sense circuit and for loading either one of those into the fuse latch circuit, whereby said fuse latch circuit will output the state of an address or a fuse according to the instructions of said fuse control circuit.

2. A fuse blow circuit according to claim 1 wherein a fuse has a first terminal providing a first fuse voltage I/O connection pad, and a second terminal coupled to said fuse blow circuit and also coupled to said fuse sense circuit, said fuse blow circuit is coupled to a second fuse voltage I/O connection pad said fuse sense circuit is coupled to said fuse blow circuit; and said fuse latch circuit is coupled to said fuse sense circuit having at least three inputs and having outputs differentially coupled to a first input to said fuse blow circuit, the output of said fuse blow circuit being coupled to an output of said second terminal of said fuse and also coupled to the input of said fuse sense circuit, and wherein a second input of said fuse blow circuit is coupled to said second fuse voltage I/O connection pad, and an output of the fuse sense circuit is coupled to a first input of the fuse latch circuit, and said address buffer for a fuse stores addresses, said address buffer having an output coupled to a second input of said fuse latch circuit, and wherein said fuse control circuit is provided for firing a fuse and has three outputs differentially coupled to a third input of said fuse latch circuit, and also has a first and second control signal inputs.

3. A fuse blow circuit according to claim 1 wherein there are a plurality of fuses and fuse latch, fuse blow and fuse sense circuits provided, and wherein said fuse control circuit is shared with other fuses.

4. A fuse blow circuit according to claim 1 wherein there are a plurality of fuses and fuse latch, fuse blow and fuse sense circuits provided, and wherein said fuse control circuit is be shared with other fuses, and said address buffer is provided for each fuse and can perform other functions on the VLSI chip.

5. A fuse blow circuit according to claim 1 wherein said fuse latch is coupled to a fuse sense and address buffer and has inputs from the outputs of said fuse sense and address buffer for passing inputs of said fuse sense during a read fuse operation and inputs of said address buffer during an override fuse and/or fuse blow operation, and has means for permanently latching either of said inputs after it has been initialized according to instructions of the fuse control circuit.

6. A fuse blow circuit according to claim 2 wherein said first and second fuse voltages are switched in opposite directions during a fuse blow operation; said first fuse voltage must be coupled to VCC during a normal operation and should go to a higher value than VCC during such blow operation, said second fuse voltage floats during a normal operation and is passed to VEE during such blow operation.

7. A fuse blow circuit according to claim 1 wherein said fuse is read using a trickle current.

8. A fuse blow circuit according to claim 1 wherein said fuse is read using a trickle current provided by a current mirror transistor and a bias voltage reference.

9. A fuse blow circuit according to claim 7 wherein there are a plurality of fuses and fuse latch, fuse blow and fuse sense circuit provided, and wherein said fuse control circuit is be shared with other fuses.

10. A fuse blow circuit according to claim 9 wherein there are a plurality of fuses and fuse latch, fuse blow and fuse sense circuits provided, and wherein said fuse control circuit is be shared with other fuses, and an address buffer is provided for each fuse and can perform other functions on the VLSI chip.

11. A fuse blow circuit according to claim 10 wherein said fuse latch is coupled to said fuse sense and address buffer and has inputs from the outputs of said fuse sense and address buffer circuits for passing inputs of said fuse sense during a read fuse operation and inputs of said address buffer during an override fuse and/or fuse blow operation, and has means for permanently latching either of said inputs after it has been initialized according to instructions of the fuse control circuit.

12. A fuse blow circuit according to claim 11 wherein said first and second terminal I/O voltages are switched in opposite directions during a fuse blow operation; said first terminal voltage must be coupled to VCC during a normal operation and should go to a higher value than VCC during such blow operation, said second terminal I/O voltage floats float during a normal operation and is passed to VEE during such blow operation.

13. A fuse blow circuit according to claim 12 wherein said fuse is read using a trickle current provided by a current mirror transistor and a bias voltage reference.

14. A fuse blow circuit according to claim 13 wherein said I/O voltages can be shared with a bank of fuses and fuse blow circuits.

* * * * *